(12) United States Patent
Kedlaya et al.

(10) Patent No.: US 11,798,820 B2
(45) Date of Patent: Oct. 24, 2023

(54) GAS DELIVERY SYSTEMS AND METHODS

(71) Applicant: Applied Materials, Inc., Santa Clara, CA (US)

(72) Inventors: Diwakar Kedlaya, San Jose, CA (US); Fang Ruan, Milpitas, CA (US); Zubin Huang, Santa Clara, CA (US); Ganesh Balasubramanian, Fremont, CA (US); Kaushik Alayavalli, Sunnyvale, CA (US); Martin Seamons, San Jose, CA (US); Kwangduk Lee, Redwood City, CA (US); Rajaram Narayanan, Santa Clara, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 395 days.

(21) Appl. No.: 17/094,969

(22) Filed: Nov. 11, 2020

(65) Prior Publication Data
US 2021/0143029 A1    May 13, 2021

Related U.S. Application Data

(60) Provisional application No. 62/934,317, filed on Nov. 12, 2019.

(51) Int. Cl.
*H01L 21/67* (2006.01)
*G01N 21/3504* (2014.01)
(Continued)

(52) U.S. Cl.
CPC ........ *H01L 21/67069* (2013.01); *C23C 16/52* (2013.01); *G01N 21/255* (2013.01); *G01N 21/3504* (2013.01); *H01L 21/67253* (2013.01)

(58) Field of Classification Search
CPC ......... C23C 16/45561; C23C 16/45112; C23C 16/52; C23C 15/455; B01F 23/191; G01N 21/3504; G01N 2021/052
See application file for complete search history.

(56) References Cited

U.S. PATENT DOCUMENTS

2004/0247787 A1   12/2004  Mackie et al.
2005/0095859 A1*   5/2005  Chen ....................... C23C 16/52
                                                                438/689
(Continued)

FOREIGN PATENT DOCUMENTS

JP    2012-212882 A    11/2012
KR    2015-0108781 A    9/2015

OTHER PUBLICATIONS

International Search Report and Written Opinion dated Mar. 5, 2021 in International Patent Application No. PCT/US2020/059934, 10 pages.

(Continued)

*Primary Examiner* — Alia Sabur
(74) *Attorney, Agent, or Firm* — Kilpatrick Townsend & Stockton LLP

(57) ABSTRACT

A system may include a main line for delivering a first gas, and a sensor for measuring a concentration of a precursor in the first gas delivered through the main line. The system may further include first and second sublines for providing fluid access to first and second processing chambers, respectively. The first subline may include a first flow controller for controlling the first gas flowed through the first subline. The second subline may include a second flow controller for controlling the first gas flowed through the second subline. A delivery controller may be configured to control the first and second flow controllers based on the measured concentration of the precursor to deliver a first mixture of the first gas and a second gas and a second mixture of the first and (Continued)

second gases into the first and second semiconductor processing chambers, respectively.

20 Claims, 5 Drawing Sheets

(51) Int. Cl.
*G01N 21/25* (2006.01)
*C23C 16/52* (2006.01)

(56) References Cited

U.S. PATENT DOCUMENTS

| | | | |
|---|---|---|---|
| 2007/0022951 A1* | 2/2007 | Spartz | C23C 16/45523 |
| | | | 118/715 |
| 2008/0044573 A1 | 2/2008 | Chen et al. | |
| 2011/0265549 A1* | 11/2011 | Cruse | F16K 37/0091 |
| | | | 73/1.16 |
| 2013/0284090 A1 | 10/2013 | Balasubramanian et al. | |
| 2014/0209177 A1* | 7/2014 | Bauer | C23C 16/52 |
| | | | 137/8 |
| 2016/0281238 A1 | 9/2016 | Arno et al. | |
| 2020/0149187 A1* | 5/2020 | Ito | C23C 16/52 |

OTHER PUBLICATIONS

Application No. PCT/US2020/059934, International Preliminary Report on Patentability, dated May 27, 2022, 9 pages.

* cited by examiner

GAS DELIVERY SYSTEMS AND METHODS

CROSS REFERENCES TO RELATED APPLICATIONS

This application claims the benefit of priority to U.S. Patent Application No. 62/934,317 filed Nov. 12, 2019, the contents of which are hereby incorporated by reference in their entirety for all purposes.

TECHNICAL FIELD

The present technology relates to semiconductor processes and equipment. More specifically, the present technology relates to semiconductor processing systems and methods for detection, control, and/or delivery of gases.

BACKGROUND

Integrated circuits are made possible by processes which produce intricately patterned material layers on substrate surfaces. As device sizes continue to shrink in next-generation devices, uniformity and precise control of processing conditions continues to increase in importance, chamber designs and system set-up may have an important role in the quality of devices produced. Thus, there is a need for systems and methods that can be used to produce high quality devices and structures.

SUMMARY

Embodiments of the present technology may include methods for precursory delivery. An exemplary method may include flowing a first gas through a first delivery main line. The first gas may include a precursor and a dilution gas. The first delivery main line may be fluidly coupled with a first delivery subline and a second delivery subline downstream of the first delivery main line. The first delivery subline may be configured to provide fluid access to a first semiconductor processing chamber from the first delivery main line. The second delivery subline may be configured to provide fluid access to a second semiconductor processing chamber from the first delivery main line. The method may further include measuring a concentration of the precursor contained in the first gas delivered through the first delivery main line. The method may also include adjusting a first flow rate of the first gas delivered through the first delivery subline based at least in part on the measured concentration of the precursor, and adjusting a second flow rate of the first gas delivered through the second delivery subline based at least in part on the measured concentration of the precursor. The method may further include delivering, to the first semiconductor processing chamber in accordance with a first recipe set point, a first mixture of the first gas delivered through the first delivery subline and a second gas may include the dilution gas. The method may also include delivering, to the second semiconductor processing chamber in accordance with a second recipe set point, a second mixture of the first gas delivered through the second delivery subline and the second gas. The first mixture and the second mixture may be simultaneously delivered to the first semiconductor processing chamber and the second semiconductor processing chamber, respectively.

In some embodiments, the precursor may include diborane. In some embodiments, the dilution gas may include hydrogen. In some embodiments, the concentration of the precursor may be measured using an optical absorption sensor. In some embodiments, the optical absorption sensor may include an elongate optical cell. The elongate optical cell may be configured to direct the first gas to flow through at least a portion of the elongate optical cell along a longitudinal axis of the elongate optical cell while the concentration of the precursor contained in the first gas may be measured by the optical absorption sensor. In some embodiments, the optical absorption sensor may include an optical filter defining a first end of the elongate optical cell. The optical filter may be configured to allow infrared radiation having one or more of the following wavenumbers to pass through: $1,600 \pm 100$ cm$^{-1}$ or $2,520 \pm 100$ cm$^{-1}$. In some embodiments, the optical absorption sensor may include an optical window defining a second end of the elongate optical cell. Light entering into the elongate optical cell through the optical window may include infrared radiation having a wavenumber ranging between about 400 cm$^{-1}$ and about 3,000 cm$^{-1}$.

In some embodiments, the first recipe set point may define a first concentration of the precursor contained in the first mixture of the first gas and the second gas. The second recipe set point may define a second concentration of the precursor contained in the second mixture of the first gas and the second gas. In some embodiments, the method may further include flowing the second gas through a second delivery main line. The second delivery main line may be fluidly coupled with a third delivery subline and a fourth delivery subline downstream of the second delivery main line. The third delivery subline may be configured to provide fluid access to the first semiconductor processing chamber from the second delivery main line. The fourth delivery subline may be configured to provide fluid access to the second semiconductor processing chamber from the second delivery main line. The method may also include adjusting a first flow rate of the second gas delivered through the third delivery subline based at least in part on the measured concentration of the precursor, and adjusting a second flow rate of the second gas delivered through the fourth delivery subline based at least in part on the measured concentration of the precursor. In some embodiments, delivering the first mixture of the first gas delivered through the first delivery subline and the second gas may include delivering the first mixture of the first gas delivered through the first delivery subline and the second gas delivered through the third delivery subline. In some embodiments, delivering the second mixture of the first gas delivered through the second delivery subline and the second gas may include delivering the second mixture of the first gas delivered through the second delivery subline and the second gas delivered through the fourth delivery subline.

Embodiments of the present technology may include systems for precursory delivery. An exemplary precursor delivery system may include a first delivery main line configured to deliver a first gas, and a precursor sensor configured to measure a concentration of a precursor contained in the first gas delivered through the first delivery main line. The precursor delivery system may also include a first delivery subline and a second delivery subline fluidly coupled with and downstream of the first delivery main line. The first delivery subline may be configured to provide fluid access to a first semiconductor processing chamber from the first delivery main line. The second delivery subline may be configured to provide fluid access to a second semiconductor processing chamber from the first delivery main line. The first delivery subline may include a first flow controller configured to control a first flow rate of the first gas flowed into the first semiconductor processing chamber. The second delivery subline may include a second flow controller configured to control a second flow rate of the first gas flowed into the second semiconductor processing chamber. The precursor delivery system may further include a precursor delivery controller communicatively coupled with the precursor sensor, the first flow controller, and the second flow controller. The precursor delivery controller may be configured to control the first flow controller based on the measured concentration of the precursor so as to deliver a first mixture of the first gas and a second gas to the first semiconductor processing chamber in accordance with a first recipe set point. The precursor delivery controller may be further configured to control the second flow controller based on the measured concentration of the precursor so as to deliver a second mixture of the first gas and the second gas to the second semiconductor processing chamber in accordance with a second recipe set point.

In some embodiments, the precursor delivery system may be configured to deliver the first mixture to the first semiconductor processing chamber and the second mixture to the second semiconductor processing chamber simultaneously. In some embodiments, the precursor may include diborane, and the first gas may further include hydrogen. The second gas may include hydrogen. In some embodiments, the precursor sensor may include an optical absorption sensor. In some embodiments, the optical absorption sensor may include an elongate optical cell may be configured to direct the first gas to flow through at least a portion of the elongate optical cell along a longitudinal axis of the elongate optical cell while the concentration of the precursor contained in the first gas may be measured by the optical absorption sensor. In some embodiments, the optical absorption sensor may include an optical filter defining a first end of the elongate optical cell. The optical filter may be configured to allow infrared radiation having one or more of the following wavenumbers to pass through: $1{,}600{\pm}100$ cm$^{-1}$ or $2{,}520{\pm}100$ cm$^{-1}$. In some embodiments, the optical absorption sensor may include an optical window defining a second end of the elongate optical cell. Light entering into the elongate optical cell through the optical window may include infrared radiation having a wavenumber ranging between about 400 cm$^{-1}$ and about 3,000 cm$^{-1}$. In some embodiments, the optical absorption sensor may further include at least one of a pressure sensor configured to measure a pressure inside the elongate optical cell or a temperature sensor configured to measure a temperature inside the elongate optical cell.

In some embodiments, the precursor delivery system may further include a second delivery main line configured to deliver the second gas. The precursor delivery system may also include a third delivery subline and a fourth delivery subline fluidly coupled with and downstream of the second delivery main line. The third delivery subline may be configured to provide fluid access to the first semiconductor processing chamber from the second delivery main line. The fourth delivery subline may be configured to provide fluid access to the second semiconductor processing chamber from the second delivery main line. The third delivery subline may include a third flow controller configured to control a first flow rate of the second gas flowed into the first semiconductor processing chamber. The fourth delivery subline may include a fourth flow controller configured to control a second flow rate of the second gas flowed into the second semiconductor processing chamber. The precursor delivery controller may be further communicatively coupled with the third flow controller and the fourth flow controller. The precursor delivery controller may be further configured to control the third flow controller based on the measured concentration of the precursor so as to deliver the first mixture to the first semiconductor processing chamber in accordance with the first recipe set point. The precursor delivery controller may be further configured to control the fourth flow controller based on the measured concentration of the precursor so as to deliver the second mixture to the second semiconductor processing chamber in accordance with the second recipe set point. In some embodiments, the first recipe set point may define a first concentration of the precursor contained in the first mixture of the first gas and the second gas. The second recipe set point may define a second concentration of the precursor contained in the second mixture of the first gas and the second gas.

Embodiments of the present technology may include semiconductor processing systems. An exemplary semiconductor processing system may include a first semiconductor processing chamber and a second semiconductor processing chamber arranged in a tandem section of the semiconductor processing system. The semiconductor processing system may also include a precursor delivery system. The precursor delivery system may include a first delivery main line configured to deliver a first gas. The first delivery main line may be fluidly coupled with a first delivery subline and a second delivery subline. The first delivery subline may include a first flow controller and may be configured to provide fluid access to the first semiconductor processing chamber from the first delivery main line. The second delivery subline may include a second flow controller and may be configured to provide fluid access to the second semiconductor processing chamber from the first delivery main line. The precursor delivery system may also include an optical absorption sensor installed along the first delivery main line. The optical absorption sensor may be configured to measure a concentration of a precursor contained in the first gas. The precursor delivery system may also include a second delivery main line configured to deliver a second gas. The second delivery main line fluidly coupled with a third delivery subline fluidly and a fourth delivery subline. The third delivery subline may include a third flow controller and may be configured to provide fluid access to the first semiconductor processing chamber from the second delivery main line. The fourth delivery subline may include a fourth flow controller and may be configured to provide fluid access to the second semiconductor processing chamber from the second delivery main line. The precursor delivery system may further include a precursor delivery controller communicatively coupled with the optical absorption sensor and the first, second, third, and fourth flow controllers. The precursor delivery controller may be configured to control the first and third flow controllers based on the measured concentration of the precursor so as to deliver a first mixture of the first and second gases to the first semiconductor processing chamber according to a first recipe set point. The precursor delivery controller may be further configured to control the second and fourth flow controllers based on the measured concentration of the precursor so as to deliver a second mixture of the first gas and the second gas to the second semiconductor processing chamber according to a second recipe set point. The precursor delivery system may be configured to deliver the first mixture and the second mixture simultaneously.

The present technology may provide numerous benefits over conventional systems and techniques. For example, the present technology may achieve precise precursor delivery into one or more processing chambers by correcting any variation in the concentration of the precursor delivered from a gas source. Further, the present technology may allow a single gas source to be utilized for delivering a precursor at different concentrations and/or amounts into one or more processing chambers to carry out different processes simultaneously. These and other embodiments, along with many of their advantages and features, may be described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Selectivity in the semiconductor industry may refer to the deposition/etch rate of one material over the other. Gas mixtures delivered into a semiconductor processing chamber may affect the selectivity. Gas mixtures may sometimes be stable, but may often be unstable. The instability in gas mixture delivery may be due to the nature of the chemistry of the gas mixtures, environmental factors, the delivery pathway configurations, etc. Instability or variation in gas mixture delivery can be detrimental to the overall processing quality of a film or substrate processed.

The present technology described herein overcomes these issues by utilizing an optical absorption sensor to measure and/or monitor a concentration of a precursor contained in a first gas delivered from a gas source. Based on the measured concentration, flow rates of the first gas and a second gas, which may be utilized to dilute the first gas and/or to correct any variation in the concentration of the precursor, may be adjusted to achieve precise delivery of the precursor into one or more processing chambers. Further, by independently adjusting the flow rates of the first gas and the second gas flowed into the one or more processing chambers, the present technology may allow a single gas source to be utilized to deliver a precursor at different concentrations and/or amounts into one or more processing chambers to carry out different processes. Although the remaining disclosure will routinely identify delivery of specific precursor and dilution gases utilizing the disclosed technology, it will be readily understood that the systems and methods are equally applicable to a variety of other process gases that may be utilized during semiconductor processing. Accordingly, the technology should not be considered to be so limited as for use with the described gases alone. Further, although an optical absorption sensor is described herein as an example, any sensor that may be used to measure the concentration and/or relative ratio of a gas mixture may be utilized and/or implemented in the present technology.

Figure 1:
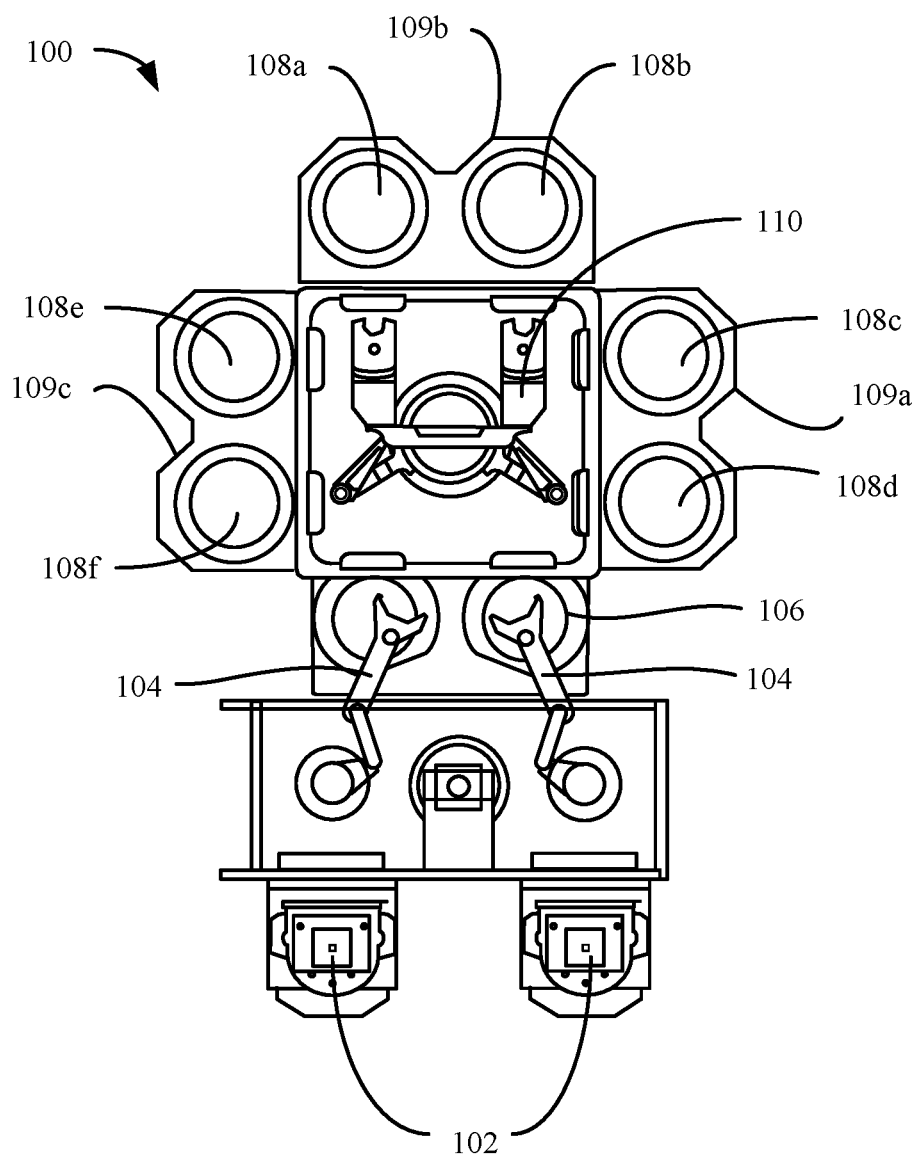
FIG. 1 shows a top plan view of one embodiment of an exemplary processing system according to embodiments of the present technology.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes and selective deposition described herein in addition to cyclical layer deposition (CLD), atomic layer deposition (ALD), chemical vapor deposition (CVD), physical vapor deposition (PVD), wet etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material or metal-containing material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments.

In some embodiments the chambers specifically include at least one etching chamber as well as at least one deposition chamber. By including these chambers in combination on the processing side of the factory interface, all etching and deposition processes may be performed in a controlled environment. For example, a vacuum environment may be maintained on the processing side of holding area 106, so that all chambers and transfers are maintained under vacuum in embodiments. This may also limit water vapor and other air components from contacting the substrates being processed. It will be appreciated that additional configurations of deposition, etching, annealing, and curing chambers for dielectric films are contemplated by system 100.

Figure 2:
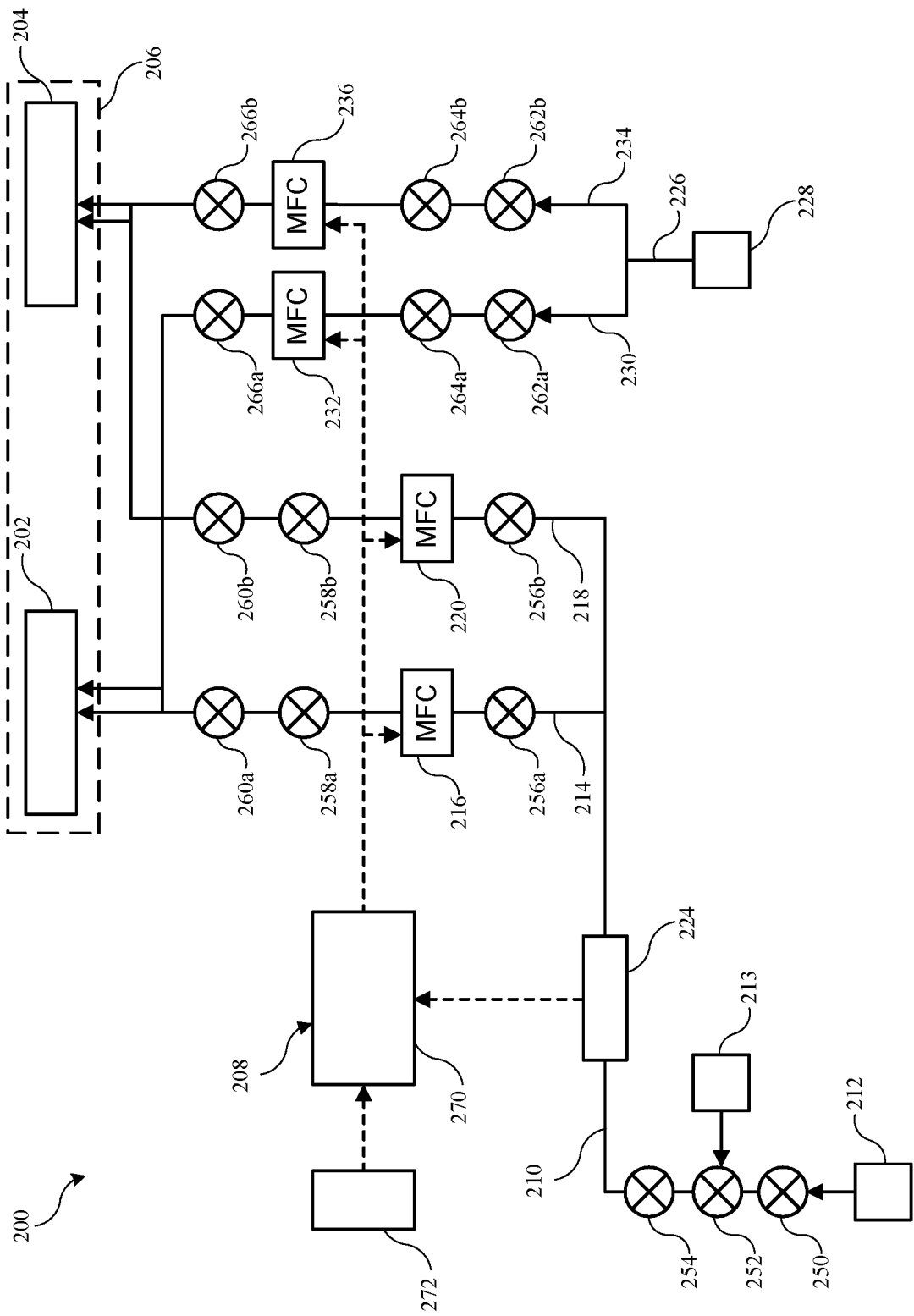
FIG. 2 schematically illustrates one embodiment of an exemplary processing system including a precursor delivery system according to embodiments of the present technology.

FIG. 2 schematically illustrates one embodiment of an exemplary processing system 200 according to embodiments of the present technology. The processing system 200 may include a first semiconductor processing chamber 202 and a second semiconductor processing chamber 204. In some embodiments, the first semiconductor processing chamber 202 and the second semiconductor processing chamber 204 may be arranged in a tandem section 206 of the processing system 200, similar to the pairs of the processing chambers 108 discussed above with reference to FIG. 1. The first processing chamber 202 and the second processing chamber 204 may be configured to carry out different processes simultaneously. The processing system 200 may further include a precursor delivery system 208 configured to deliver one or more precursors or gas mixtures into the first semiconductor processing chamber 202 and/or the second semiconductor processing chamber 204. In some embodiments, the precursor delivery system 208 may be configured to deliver one or more precursors or gas mixtures into the first and/or second processing chambers 202, 204 simultaneously and/or independently.

The precursor delivery system 208 may include a first delivery main line 210 configured to deliver a first gas from a first gas source 212, such as a precursor source. Depending on the gas, the first gas source 212 may include a cylinder or other container for storing the first gas in a solid, liquid, and/or gaseous form, which may be vaporized for delivery through the first delivery main line 210. In some embodiments, the first delivery main line 210 may also be configured to deliver a purge gas, such as nitrogen, from a purge gas source 213 or any other gases suitable for semiconductor processing. Although two gas sources are shown in FIG. 1, the first delivery main line 210 may be configured to deliver only one or more than two gases from one or multiple gas sources.

The precursor delivery system 208 may further include a first delivery subline 214 fluidly coupled with the first delivery main line 210. The first delivery subline 214 may be configured to provide fluid access to the first processing chamber 202 from the first delivery main line 210. In some embodiments, the first delivery subline 214 may include a flow controller 216, such as a mass flow controller, configured to control a flow rate of the first gas delivered through the first delivery subline 214 into the first processing chamber 202. In some embodiments, the precursor delivery system 208 may further include a second delivery subline 218 fluidly coupled with the first delivery main line 210. The second delivery subline 218 may be configured to provide fluid access to the second processing chamber 204 from the first delivery main line 210. In some embodiments, the second delivery subline 218 may include a flow controller 220, such as a mass flow controller, configured to control a flow rate of the first gas delivered through the second delivery subline 218 into the second processing chamber 204.

In some embodiments, the precursor delivery system 208 may further include a precursor sensor 224 installed along the first delivery main line 210 and upstream of the first delivery subline 214 and the second delivery subline 218. In some embodiments, the precursor sensor 224 may include an optical absorption sensor. The precursor sensor 224 may be configured to measure a concentration of one or more precursors contained in the first gas delivered through the first delivery main line 210 as will be discussed in more detail below.

In some embodiments, the precursor delivery system 208 may further include a second delivery main line 226 configured to deliver a second gas from a second gas source 228, such as a dilution gas source. Depending on the gas, the second gas source 228 may include a cylinder or other container for storing the second gas in a solid, liquid, and/or gaseous form, which may be vaporized for delivery through the second delivery main line 226.

In some embodiments, the precursor delivery system 208 may further include a third delivery subline 230 fluidly coupled with the second delivery main line 226. The third delivery subline 230 may be configured to provide fluid access to the first processing chamber 202 from the second delivery main line 226. In some embodiments, the third delivery subline 230 may include a flow controller 232, such as a mass flow controller, configured to control a flow rate of the second gas flowed through the third delivery subline 230 into the first processing chamber 202. In some embodiments, the precursor delivery system 208 may further include a fourth delivery subline 234 fluidly coupled with the second delivery main line 226. The fourth delivery subline 234 may be configured to provide fluid access to the second processing chamber 204 from the second delivery main line 226. In some embodiments, the fourth delivery subline 234 may include a flow controller 236, such as a mass flow controller, configured to control a flow rate of the second gas flowed through the fourth delivery subline 234 into the second processing chamber 204.

Although the third delivery subline 230 and fourth delivery subline 234 are described as being fluidly coupled with the second delivery main line 226 in the embodiment shown in FIG. 2, in some embodiments, the second delivery main line 226 may be omitted. In some embodiments, each of the third delivery subline 230 and the fourth delivery subline 234 may be coupled to a dilution gas source. The dilution gas source coupled to the third delivery subline 230 and the fourth delivery subline 234 may be the same in some embodiments, or may be different in some embodiments.

Along the first and/or second delivery main lines 210, 226 and/or the first, second, third, and/or fourth delivery sublines 214, 218, 230, 234, one or more valves may be installed for safety and/or to prevent cross contamination. In some embodiments, along the first delivery main line 210, a manual valve and/or safe valve 250 may be installed downstream of the first gas source 212. A purge valve 252 may be installed downstream of the purge gas source 213. An upstream valve 254 may be installed downstream of the first gas source 212 and the purge gas source 213 and upstream of the precursor sensor 224. In some embodiments, along the first and second delivery sublines 214, 218, upstream valves 256a, 256b may be installed upstream of the respective flow controllers 216, 220, and downstream valves 258a, 258b may be installed downstream of the respective flow controllers 216, 220. Final valves 260a, 260b may also be installed downstream of the valves 256, 258 and upstream of the respective first and second processing chambers 202, 204. In some embodiments, along the third and fourth delivery sublines 230, 234, manual valves 262a, 262b may be installed downstream of the second gas source 228, and upstream valves 264a, 264b may be installed downstream of the respective manual valves 262a, 262b and upstream of the respective flow controllers 232, 236. Further, along the third and fourth delivery sublines 230, 234, final valves 266a, 266b may also be installed downstream of the respective flow controllers 232, 236 and upstream of the respective first and second processing chambers 202, 204.

In some embodiments, the precursor delivery system 208 may further include a precursor delivery controller 270. The precursor delivery controller 270 may be communicatively coupled with the precursor sensor 224 and may be configured to receive from the precursor sensor 224 measurements indicative of the concentration of one or more precursors contained in the first gas. The precursor delivery controller 270 may also be communicatively coupled with the flow controllers 216, 220, 232, 236 and may be configured to independently control each of the flow controllers 216, 220, 232, 236 to adjust the respective flow rates of the first and/or second gases flowed into the first and/or second processing chambers 202, 204 so as to deliver gas mixtures in accordance with one or more semiconductor processing recipes. Specifically, in some embodiments, the precursor delivery controller 270 may be further communicatively coupled with a processing recipe data store 272. The processing recipe data store 272 may be configured to store semiconductor processing recipes, which may include processing set points, such as flow rates of one or more precursors and/or dilution gases, the concentration of the one or more precursors, processing pressure, processing temperature, etc. The precursor delivery controller 270 may be configured to retrieve or obtain, among other things, the processing recipe set points from the processing recipe data store 272. Based on the retrieved processing set points and the measured concentration of the one or more precursors in the first gas, the precursor delivery controller 270 may control and/or adjust one or more of the flow controllers 216, 220, 232, 236 independent of each other to deliver gas mixtures into the first and/or second processing chambers 202, 204 accordingly.

As mentioned above, gas mixtures can be unstable due to nature of chemistry, environmental factors, delivery pathway configurations, etc. For example, the first gas may include a precursor, such as diborane ($B_2H_6$), that may be diluted with a dilution gas, such as hydrogen ($H_2$), at a specified concentration, e.g., about 10% to about 30%, which may be higher than the processing set points of various processing recipes. However, the delivered concentration of the precursor from the first gas source 212 may deviate from the specified concentration due to various reasons. Such deviation in the concentration of the precursor delivered may lead to variation in the amount and/or concentration of the precursor delivered into the first and/or second processing chambers 202, 204 for processing semiconductor substrates housed therein. The variation in the amount and/or concentration of the precursor delivered can be detrimental to the quality of the substrates, such as quality of the films, processed.

To limit or prevent variation in the amount of precursor delivered into the first and/or second processing chambers 202, 204, the concentration of the precursor delivered from the first gas source 212 may be monitored and/or measured using the precursor sensor 224. The measured concentration of the precursor may be utilized to further dilute the first gas containing the precursor using the second gas, which may be hydrogen ($H_2$), such that a precise amount of the precursor may be delivered into the first and/or second processing chambers 202, 204 in accordance with the processing set points.

Specifically, in some embodiments, based on the measured concentration of the precursor contained in the first gas, the precursor delivery controller 270 may be configured to control the flow controller 216 and the flow controller 232 so as to control the flow rate of the first gas and the flow rate of the second gas, respectively, flowed into the first processing chamber 202. By controlling the flow rates of the first gas and the second gas flowed into the first processing chamber 202 based on the measured concentration of the precursor, a correct, precise amount of the precursor may be delivered into the first processing chamber 202 in accordance with a first recipe processing set point. Similarly, based on the measured concentration of the precursor contained in the first gas, the precursor delivery controller 270 may be further configured to control the flow controller 220 and the flow controller 236 so as to control the flow rate of the first gas and the flow rate of the second gas, respectively, flowed into the second processing chamber 204. By controlling the flow rates of the first gas and the second gas flowed into the second processing chamber 204 based on the measured concentration of the precursor, a correct, precise amount of the precursor may be delivered into the second processing chamber 204 in accordance with a second recipe processing set point.

As mentioned above, the first processing chamber 202 and the second processing chamber 204 may be configured to carry out different processes simultaneously and/or independent of each other. For example, by controlling the flow controllers 216, 220, 232, 236 independent of each other, different gas mixtures with different concentrations of the precursor may be delivered into the first and/or second processing chambers 202, 204. For example, while a first gas mixture of the first gas and the second gas may be delivered into the first processing chamber 202, a second gas mixture of the first gas and the second gas may be delivered into the second processing chamber 204, and the first and the second gas mixtures may include different concentrations of the precursor contained therein. The different concentrations may be specified by the respective processing set points for the first processing chamber 202 and the second processing chamber 204.

There are several advantages associated with the precursor delivery system 208 described herein. By controlling the flow rates of the first and second gases delivered into the different processing chambers, e.g., the first and/or second processing chambers 202, 204, different amounts and/or concentrations of the precursor may be delivered into the different processing chambers. Additionally, mixtures of the first and second gases may be delivered at different total flow rates in accordance with different recipes and/or processing set points. Further, the processing system 200 may allow a single gas source, e.g., first gas source 212, to be used for delivering the precursor at different levels or concentrations into the different processing chambers to carry out different processes in accordance with different processing recipe set points, instead of using multiple gas sources when multiple processes may be carried out in multiple chambers. Moreover, by measuring the concentration of the precursor delivered from the gas source, precise control of the amount and/or concentration of the precursor delivered may be achieved, and instability and/or drift in the amount of the precursor delivered into the processing chamber may be avoided. It should be noted that although only two processing chambers 202, 204 are shown in FIG. 2, the processing system 200 may include only one or more than two processing chambers. The precursor delivery system 208 may be configured to deliver from one gas source different amounts and/or concentrations of precursors into the different processing chambers, such as into three, four, five, six, etc., different processing chambers simultaneously and/or independent of each other.

Figure 3:
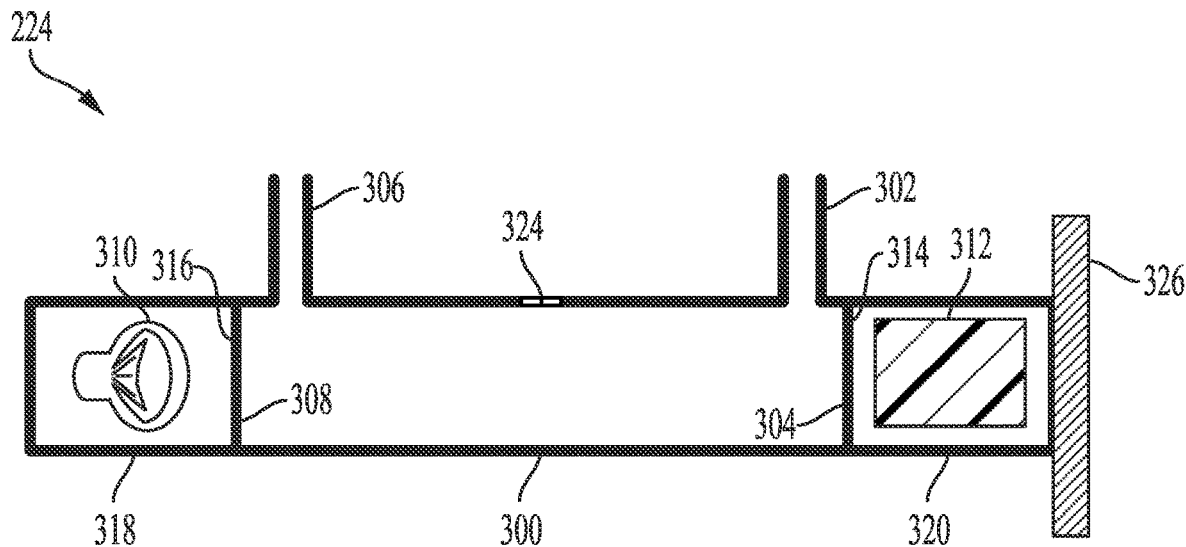
FIG. 3 schematically illustrates an exemplary configuration of a precursor sensor according to embodiments of the present technology.

FIG. 3 schematically illustrates an exemplary configuration of the precursor sensor 224 according to embodiments of the present technology. The precursor sensor 224 may include an optical absorption sensor, such as a nondispersive infrared sensor. However, any sensor that may be used to measure the concentration and/or relative ratio of a gas mixture may be utilized and/or implemented in the present technology. In some embodiments, the precursor sensor 224 may include an elongate optical cell 300. The optical cell 300 may include an inlet 302 that may be disposed proximate a first end 304 of the optical cell 300. The first end 304 of the optical cell 300 may be defined by an optical filter as will be discussed in more detail below. The inlet 302 may provide fluid access from the first gas source 212 to the optical cell 300. The optical cell 300 may further include an outlet 306 disposed proximate a second end 308 of the optical cell 300. The second end 308 of the optical cell 300 may be defined by an optical window as will be discussed in more detail below. The outlet 306 may provide fluid access from the optical cell 300 downstream to the first and/or second delivery sublines 214, 218. In some embodiments, the optical cell 300 may be made of metal, such as stainless steel, aluminum with or without surface coating or treatments such as anodization, aluminum oxide, or aluminum nitride. Other suitable material for making the optical cell 300 may be selected based on the fluid flow through the optical cell 300 and various other considerations.

The precursor sensor 224 may further include a light source 310 and a light detector 312 disposed at opposite ends of the optical cell 300. An optical filter 314 defining the first end 304 of the optical cell 300 may be disposed between the optical cell 300 and the light detector 312. An optical window 316 defining the second end 308 of the optical cell 300 may be disposed between the optical cell 300 and the light source 310. In the embodiment shown in FIG. 3, the light source 310 may be disposed at the second end 308 of the optical cell 300 and proximate the outlet 306, and the light detector 312 may be disposed at the first end 304 of the optical cell 300 and proximate the inlet 302. In some embodiments, the light source 310 may be disposed at the first end 304 of the optical cell 300 and proximate the inlet 302, and the light detector 312 may be disposed at the second end 308 of the optical cell 300 and proximate the outlet 306. Although the figures illustrate that the inlet 302 and/or the outlet 306 may be disposed at a sidewall of the optical cell 300 and oriented at an angle with respect to the longitudinal axis of the optical cell 300, the inlet 302 and/or the outlet 306 may be disposed at any suitable location of the optical cell 300, such as the opposite ends of the optical cell 300 and/or may be oriented parallel to the longitudinal axis of the optical cell 300.

The light source 310 and the light detector 312 may be placed in a light source compartment 318 and a light detector compartment 320, respectively. In some embodiments, the light source compartment 318 and the light detector compartment 320 may each include a common cross section as the optical cell 300, which may be circular, oval, polygonal, e.g., triangular, square, diamond, rectangular, pentagonal, hexagonal, or of any suitable shape. Thus, the light source compartment 318, the optical cell 300, and the light detector compartment 320 may define an elongate body of the precursor sensor 224. In some embodiments, at least one of the light source compartment 318 and/or the light detector compartment 320 may have a different cross sectional size and/or shape from that of the optical cell 300 to accommodate the various light source 310 and/or the light detector 312 that may be utilized for the precursor sensor 224.

The optical cell 300 may define a linear optical path for the light emitted from the light source 310. The light source 310, the optical window 316, the optical cell 300, the optical filter 314, and the light detector 312 may be aligned along a longitudinal axis of the optical cell 300 such that the light emitted from the light source 310 may travel through the optical cell 300 and detected by the light detector 312. Thus, when the first gas may be flowed through the optical cell 300, the first gas may be analyzed using, e.g., optical absorption. For example, a level or concentration of the precursor included in the first gas, such as the level or concentration of diborane contained in the first gas, may be measured. The measured level or concentration of the precursor may be further utilized to control the flow controllers 216, 220, 232, 236 to ensure precise amounts and/or concentrations of the precursor may be delivered into the first and/or second processing chambers 202, 204.

In some embodiments, the precursor sensor 224 may further include one or more sensors 324, such as a pressure sensor and/or a temperature sensor, configured to measure a pressure and/or a temperature inside the optical cell 300. Although in FIG. 3, the one or more sensors 324 are located together and disposed at a cell wall of the optical cell 300, in some embodiments, the one or more sensors 324 may be disposed at separate locations, such as at different locations of the cell wall of the optical cell 300, at the inlet 302, at the outlet 306, or any other suitable location for measuring the temperature and/or pressure inside the optical cell 300. The precursor sensor 224 may further include a circuit board 326 electrically connecting the light source 310, light detector 312, and/or other electronic or electrical components, such as the one or more sensors 224. In some embodiments, the various components of the precursor sensor 224 described herein may be housed in a sensor enclosure.

Figure 4:
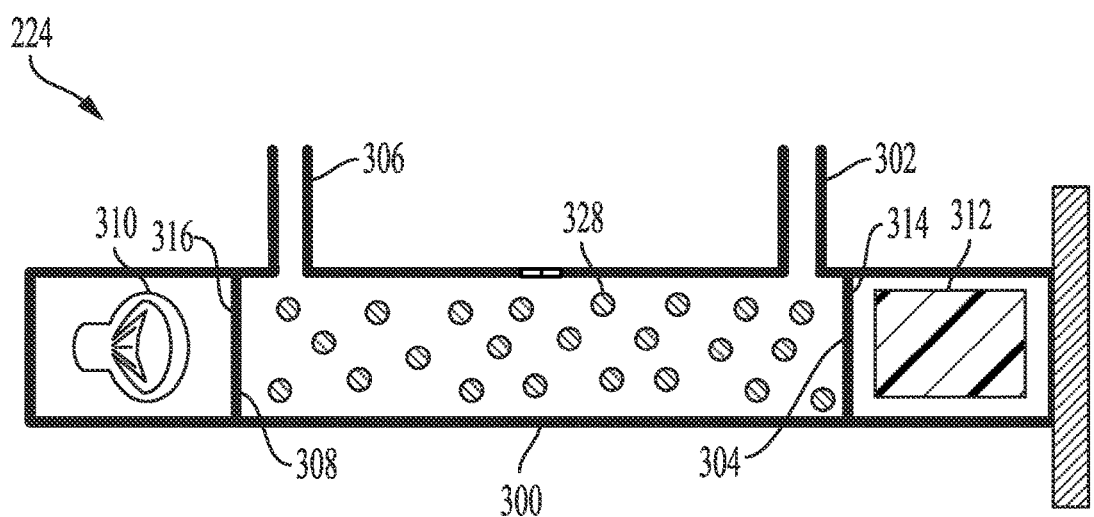
FIG. 4 schematically illustrates a fluid flow through the precursor sensor of FIG. 3 according to embodiments of the present technology.

FIG. 4 schematically illustrates a fluid being flowed through and analyzed by the precursor sensor 224 according to embodiments of the present technology. The fluid flow may be or include the first gas 328 flowed from the first gas source 212 into the optical cell 300 via the inlet 302. The first gas 328 may then be directed to flow through the optical cell 300 along the longitudinal axis of the optical cell 300 towards the outlet 306. Light (not shown in FIG. 4) may be emitted from the light source 310 and may travel though the optical cell 300 filled with the first gas 328. Some of the light may be absorbed by the first gas 328, e.g., absorbed by the diborane contained in the first gas 328. The concentration of diborane contained in the first gas 328 may then be analyzed based on the absorption of the light by the first gas 328 using the light detector 312.

To facilitate measurement of the level or concentration of diborane, the optical window 316 may be configured to allow light that may be absorbed by diborane to pass through from the light source 310. For example, in some embodiments, the optical window 316 may be configured to allow light, such as infrared radiation to pass and enter into the optical cell 300. The infrared radiation passing through the optical window 316 may have a wavenumber ranging between about 400 $cm^{-1}$ and about 3,000 $cm^{-1}$ or a wavelength ranging between about 2 μm and about 30 μm. These ranges may encompass multiple absorption wavelengths characteristic to diborane, which may include infrared radiation having the following wavenumbers: 1,600±100 $cm^{-1}$, 2,520±100 $cm^{-1}$, and/or other characteristic wavenumbers, or infrared radiation having the following wavelengths: 3,968±100 nm, 6,250±100 nm, and/or other characteristic wavelengths.

In some embodiments, the optical window 316 may be selected and/or configured to allow radiation that may encompass more or less absorption wavelengths characteristic to diborane to pass through. In some embodiments, the optical window 316 may be selected and/or configured to allow radiation that may encompass only a single absorption wavelength characteristic to diborane to pass through. In some embodiments, the optical window 316 may be configured to pass infrared radiation having a wavenumber ranging between about 1,000 cm$^{-1}$ and about 2,000 cm$^{-1}$, between about 1,200 cm$^{-1}$ and about 2,800 cm$^{-1}$, between about 2,000 cm$^{-1}$ and about 3,200 cm$^{-1}$, or any other suitable ranges. Exemplary material that may be suitable for the optical window 316 may include potassium bromide, sapphire, barium fluoride, germanium, or any other suitable material that may allow radiation absorbable by diborane to pass through. The material for the optical window 316 may also be selected and/or configured to be corrosion resistant. During semiconductor processing, the various gases or precursors utilized may be corrosive. The exemplary materials described herein may not only allow radiation absorbable by diborane to pass through, but may also be resistant to corrosion by the various gases flowed through, and thus prolong the operational life of the precursor sensor 224.

In some embodiments, to facilitate measurement of the level or concentration of diborane, the optical filter 314 may be selected and/or configured to allow radiation encompassing a single absorption wavelength characteristic to diborane to pass through. For example, the filter 314 may be selected and/or configured to allow infrared radiation having any of the following wavenumbers: 1,600±100 cm$^{-1}$, 2,520±100 cm$^{-1}$, and/or other wavenumbers characteristic to diborane absorption, or infrared radiation having any of the following wavelengths: 3,968±100 nm, 6,250±100 nm, and/or other characteristic wavelengths characteristic to diborane absorption. In some embodiments, the filter 314 may be selected and/or configured to allow radiation encompassing more than one absorption wavelengths characteristic to diborane to pass through. Similar to the optical window 316, the various materials that may be suitable for the filter 314 may also be resistant to corrosion by the various gases flowed through the optical cell 300. As described herein, the optical window 316 and/or the filter 314 may be selected or configured specifically for detecting diborane. Without specifically configuring or selecting the optical window 316 and/or the filter 314 as described herein, effective detection of the level or concentration of diborane under conditions suitable for semiconductor processing may not be achieved.

In some embodiments, the fluid flowed through the optical cell 300 may include one or more precursors instead of or in addition to diborane. The one or more precursors may include tetraborane, arsine, phosphine, and/or the like. The optical window 316 and/or the filter 314 may be further configured to facilitate detection of the level or concentration of one or more of tetraborane, arsine, phosphine, etc. For example, the optical window 316 may be configured to allow radiation that may encompass one or more absorption wavelengths characteristic to tetraborane, arsine, phosphine, and/or other precursors that may be included in the first gas. The filter 314 may be configured to allow radiation encompassing a single or multiple absorption wavelengths characteristic to tetraborane, arsine, phosphine, and/or other precursors for detecting the level or concentration thereof.

Figure 5A:
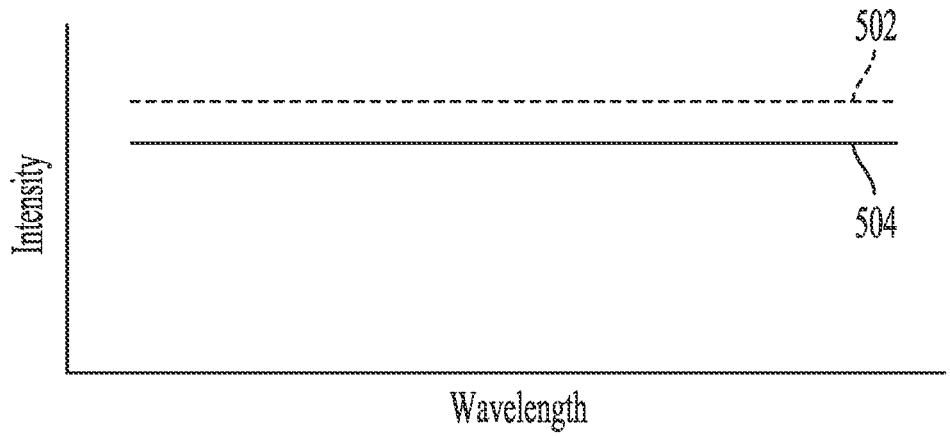
FIGS. 5A and 5B schematically illustrate exemplary radiation intensity measurements according to embodiments of the present technology.
Figure 5B:
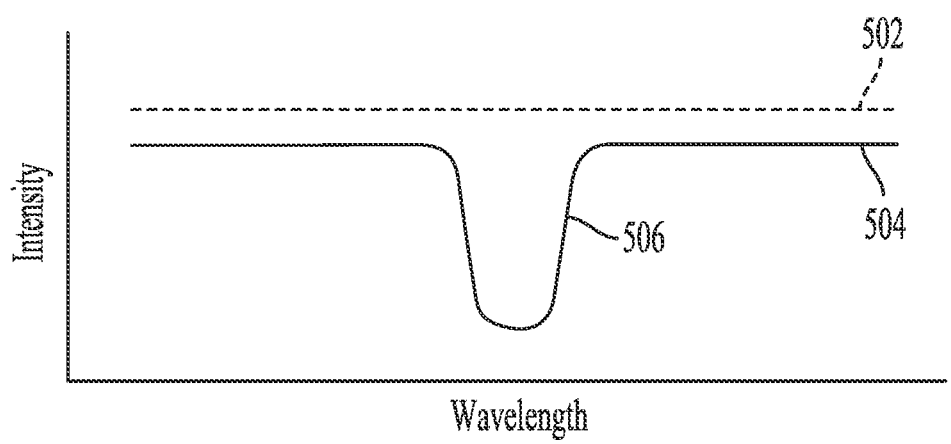

The light detector 312 may be configured to detect an intensity of the incoming light, more specifically, a decrease in the intensity of the incoming light at wavelength or wavelengths characteristic to the precursor absorption to determine the level or concentration of the precursor, such as diborane, tetraborane, arsine, phosphine, and/or other precursors. FIGS. 5A and 5B schematically illustrate the detected radiation intensity according to embodiments of the present technology. Signal 502 in both FIGS. 5A and 5B may represent a reference signal 502 that may remain consistent during normal operation of the precursor sensor 224. The reference signal 502 may decrease due to degradation of the light source 310. Thus, the reference signal 502 may be utilized to conduct sensor health checks and/or periodical baseline checks. Signal 504 in FIGS. 5A and 5B may represent the intensity of radiation detected by the light detector 312 for measuring the level or concentration of one or more precursors of interest that may be flowed through the optical cell 300. FIG. 5A schematically illustrates the embodiments where no fluid may be flowed through the optical cell 300 or where the fluid being flowed through the optical cell 300 may not absorb any of the radiation emitted from the light source 310. Accordingly, no decrease in the intensity signal 504 may be detected. FIG. 5B schematically illustrates the embodiments where the fluid passing through the optical cell 300 may absorb at least some of the radiation, as shown in the decrease 506 in the radiation intensity as measured by the light detector 312. For example, the fluid being flowed through the optical cell 300 may be or include the first gas flowed from the processing chamber 102 and thus may contain diborane in some embodiments. Then the decrease 506 in the radiation intensity at the absorption wavelength characteristic to diborane may be detected due to the presence of diborane. Although the decrease 506 is only shown at or near one wavelength, decrease at or near multiple wavelengths may be detected depending on the configuration of the light source 310 and/or the light detector 312. The detected decrease in the radiation intensity due to absorption may be used to determine the level or concentration of diborane contained in the first gas. In some embodiments, the level or concentration of diborane may be represented by a partial pressure of diborane. Thus, based on the radiation intensity measurements, the partial pressure of diborane contained in the first gas may be determined.

In some embodiments, the pressure of the first gas being flowed through optical cell 300 may be relatively low and may range between about 1 mTorr and about 10 Torr, e.g., between about 1 mTorr and about 5 Torr, between about 1 mTorr and about 4 Torr, between about 1 mTorr and about 3 Torr, between about 1 mTorr and about 2 Torr, or between about 1 mTorr and about 1 Torr. Many conventional diborane detectors may not operate under these low pressure ranges. In contrast, the configuration of the precursor sensor 224 described herein may effectively detect diborane contained in the first gas at the relatively low pressure ranges. For example, the precursor sensor 224 described herein may effectively detect a partial pressure of diborane that may be as low as less than or about 100 parts per million (ppm), less than or about 90 ppm, less than or about 80 ppm, less than or about 70 ppm, less than or about 60 ppm, less than or about 50 ppm, less than or about 40 ppm, less than or about 30 ppm, less than or about 20 ppm, less than or about 10 ppm, less than or about 5 ppm, less than or about 3 ppm, less than or about 1 ppm, or less.

In some embodiments, the detected partial pressure of diborane may range between about 1 ppm and about 900,000 ppm, e.g., between about 1 ppm and about 500,000 ppm, between about 1 ppm and about 100,000 ppm, between about 1 ppm and about 50,000 ppm, between about 1 ppm and about 10,000 ppm, between about 1 ppm and about 5,000 ppm, between about 1 ppm and about 3,000 ppm, between about 1 ppm and about 1,000 ppm, between about 1 ppm and about 500 ppm, between about 1 ppm and about 400 ppm, between about 1 ppm and about 300 ppm, between about 1 ppm and about 200 ppm, between about 1 ppm and about 100 ppm, between about 1 ppm and about 90 ppm, between about 1 ppm and about 80 ppm, between about 1 ppm and about 70 ppm, between about 1 ppm and about 60 ppm, between about 1 ppm and about 50 ppm, between about 1 ppm and about 40 ppm, between about 1 ppm and about 30 ppm, between about 1 ppm and about 20 ppm, between about 1 ppm and about 10 ppm, between about 1 ppm and about 5 ppm, or between about 1 ppm and about 3 ppm.

Although an optical absorption sensor is described herein as an example of the precursor sensor 224, in some embodiments, the precursor sensor 224 may be or include an acoustic sensor. The acoustic sensor may measure the concentration of the precursor by transmitting a high frequency, e.g., in the MHz range, spread-spectrum acoustical signal through the gas being flowed through the sensor. A maximum likelihood time delay between a first received signal and its echo may be calculated. Based on the maximum likelihood time delay, the speed of sound in the gas being flowed through the sensor may be calculated. Based on the calculated speed of sound, the concentration of the precursor contained in the gas may be determined.

Figure 6:
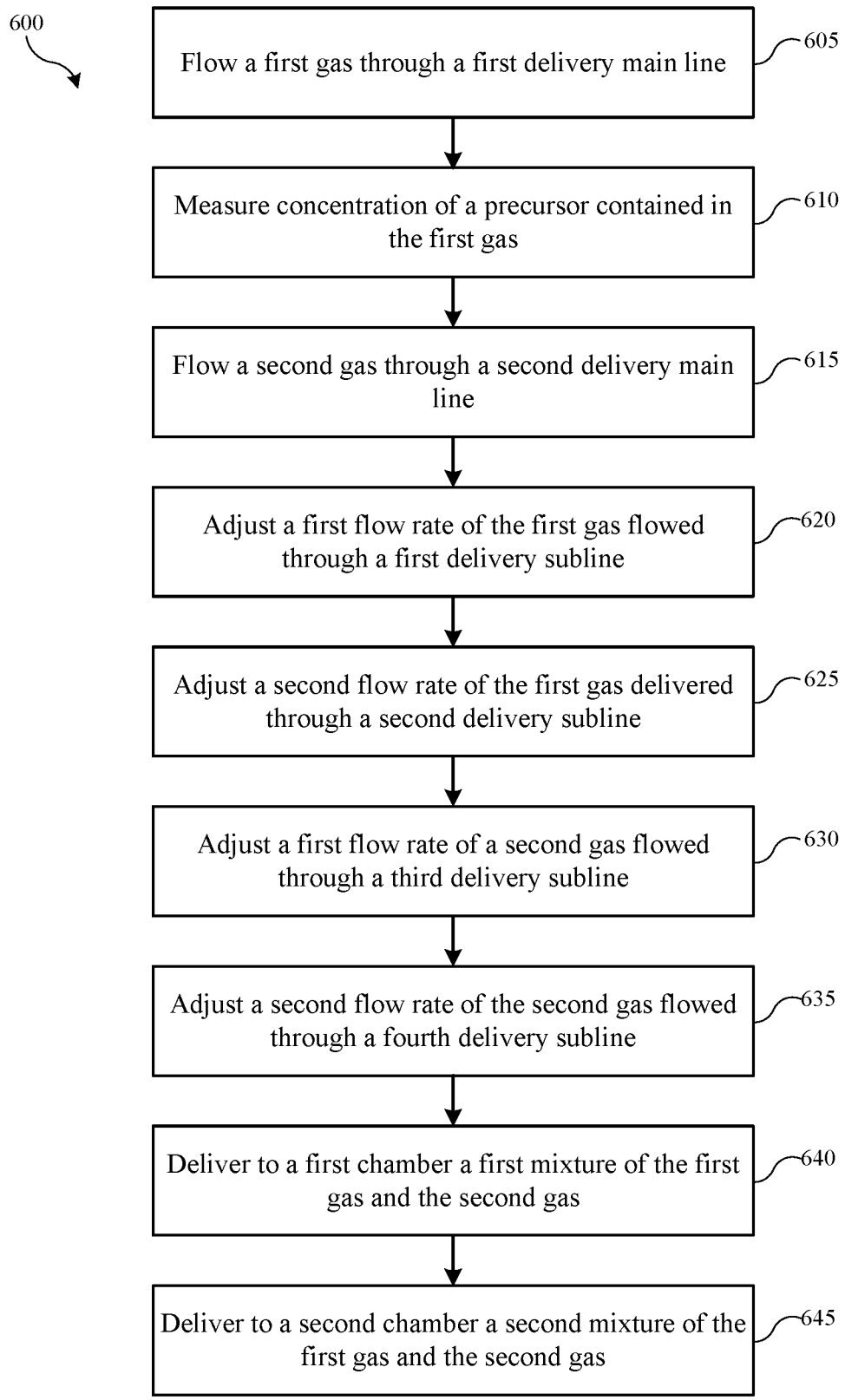
FIG. 6 shows exemplary operations in a method for precursor delivery according to embodiments of the present technology.

The processing systems discussed previously may be used in performing exemplary semiconductor methods. FIG. 6 shows exemplary operations in a method 600 for precursor delivery according to embodiments of the present technology. The delivered precursor may be used for various semiconductor processes including deposition and/or etching. Some or all of the operations may be performed using the chambers and/or system as previously described, or may be performed in different chambers and/or systems.

Method 600 may begin at operation 605 by flowing a first gas from a first gas source through a first delivery main line of a semiconductor processing system, such as the first delivery main line 210 of the semiconductor processing system 200 described above. The first gas may include a precursor and a dilution gas. In some embodiments, the precursor may include diborane. In some embodiments, the dilution gas may include hydrogen. In some embodiments, the first delivery main line may be fluidly coupled with a first delivery subline and a second delivery subline, such as the first delivery subline 214 and the second delivery subline 218, downstream of the first delivery main line. The first delivery subline may be configured to provide fluid access from the first delivery main line to a first semiconductor processing chamber, such as the first processing chamber 202 of the processing system 200. The second delivery subline may be configured to provide fluid access from the first delivery main line to a second semiconductor processing chamber, such as the second processing chamber 204 of the processing system 200. Thus, the first and second chambers may be configured to carry out different semiconductor processes simultaneously.

At operation 610, a concentration of the precursor contained in the first gas delivered through the first delivery main line may be measured. The concentration of the precursor may be measured using an optical absorption sensor, such as the precursor sensor 224 described above with reference to FIG. 3. Thus, in some embodiments, the optical absorption sensor may include an elongate optical cell, such as the optical cell 300 described above. The optical cell may be configured to direct the first gas to flow through at least a portion of the optical cell along a longitudinal axis of the optical cell while the concentration of the precursor contained in the first gas may be measured. In some embodiments, the optical absorption sensor may include an optical filter, such as the optical filter 314 described above, that may define a first end of the elongate optical cell. The optical absorption sensor may also include an optical window, such as the optical window 316 described above, that may define a second end of the elongate optical cell opposite to the first end of the optical cell. The optical absorption sensor may further include a light detector, such as the light detector 312, and a light source, such as the light source 310, disposed at the opposing first and second ends of the optical cell. To facilitate detection of the precursor, such as diborane, the optical window may be configured to allow radiation having a wavenumber ranging between about 400 $cm^{-1}$ and about 3,000 $cm^{-1}$ to enter into the optical cell through the optical window. The optical filter may be configured to allow radiation characteristic to diborane absorption to pass through and to be detected by the light detector, such as radiation having a wavenumber of at least one of 1,600±100 $cm^{-1}$, 2,520±100 $cm^{-1}$, or other wavenumbers characteristic to diborane absorption, In some embodiments, at operation 615, a second gas may be flowed from a second gas source through a second delivery main line, such as the second delivery main line 226 of the processing system 200 described above. The second gas may include a dilution gas, such as hydrogen. The second delivery main line may be fluidly coupled with a third delivery subline and a fourth delivery subline, such as the third delivery subline 230 and the fourth delivery subline 234, downstream of the second delivery main line. The third delivery subline may be configured to provide fluid access from the second delivery main line to the first semiconductor processing chamber. The fourth delivery subline may be configured to provide fluid access to the second semiconductor processing chamber from the second delivery main line.

At operation 620, a first flow rate of the first gas delivered through the first delivery subline may be adjusted based at least in part on the measured concentration of the precursor. At operation 625, a second flow rate of the first gas delivered through the second delivery subline may also be adjusted based at least in part on the measured concentration of the precursor. In some embodiments, the method may further include, at operation 630, adjusting a first flow rate of the second gas delivered through the third delivery subline based at least in part on the measured concentration of the precursor, and, at operation 635, adjusting a second flow rate of the second gas delivered through the fourth delivery subline based at least in part on the measured concentration of the precursor. The adjustments may be made by controlling a flow controller, such as mass flow controllers, installed along each of the first, second, third, fourth delivery sublines, such as the flow controllers 216, 220, 232, 236 described above. The flow controllers may be communicatively coupled with a precursor delivery controller, such as the precursor delivery controller 270 described above. The precursor delivery controller may be configured to receive processing recipe set points from a processing recipe data store, such as the processing recipe data store 272, and the measured concentration of the precursor from the optical absorption sensor. The processing set points may specify the concentration of the precursor in a gas mixture delivered into each processing chamber, the flow rate of one or more gases flowed into the processing chamber, etc., to carry out various semiconductor processes. Based on the measured concentration of the precursor and the processing recipe set points, the precursor delivery controller may control the flow rates of the first and/or second gases delivered through the first, second, third, and/or fourth sublines.

At operation 640, a first gas mixture of the first gas delivered through the first delivery subline and the second gas delivered through the third delivery subline may be delivered to the first semiconductor processing chamber in accordance with a first recipe set point. The first recipe set point may define or specify a first concentration of the precursor contained in the first mixture of the first gas and the second gas. At operation 645, a second mixture of the first gas delivered through the second delivery subline and the second gas delivered through the fourth delivery subline may be delivered to the second semiconductor processing chamber in accordance with a second recipe set point. The second recipe set point may define or specify a second concentration of the precursor contained in the second mixture of the first gas and the second gas. The first and second recipe set points may be the same as or different from each other. As mentioned above, in some embodiments, the first and second processing chambers may be configured to carry out different processing recipes simultaneously. Thus, the first gas mixture and the second gas mixture may be delivered simultaneously to the first semiconductor processing chamber and the second semiconductor processing chamber, respectively, to carry out different processes that may utilize different amounts and/or concentrations of the precursor.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method, comprising:
    flowing a first gas comprising a precursor and a dilution gas through a first delivery main line, wherein the first delivery main line is fluidly coupled with a first delivery subline and a second delivery subline downstream of the first delivery main line, the first delivery subline configured to provide fluid access to a first semiconductor processing chamber from the first delivery main line, the second delivery subline configured to provide fluid access to a second semiconductor processing chamber from the first delivery main line;
    measuring a concentration of the precursor contained in the first gas delivered through the first delivery main line to obtain a measured concentration of the precursor;
    adjusting a first flow rate of the first gas delivered through the first delivery subline based at least in part on the measured concentration of the precursor;
    adjusting a second flow rate of the first gas delivered through the second delivery subline based at least in part on the measured concentration of the precursor;
    delivering, to the first semiconductor processing chamber in accordance with a first recipe set point, a first mixture of the first gas delivered through the first delivery subline and a second gas comprising the dilution gas; and
    delivering, to the second semiconductor processing chamber in accordance with a second recipe set point, a second mixture of the first gas delivered through the second delivery subline and the second gas, wherein the first mixture and the second mixture comprise different concentrations of the first gas, and wherein the first mixture and the second mixture are simultaneously delivered to the first semiconductor processing chamber and the second semiconductor processing chamber, respectively.

2. The method of claim 1, wherein the precursor comprises diborane.

3. The method of claim 1, wherein the dilution gas comprises hydrogen.

4. The method of claim 1, wherein the concentration of the precursor is measured using an optical absorption sensor.

5. The method of claim 4, wherein the optical absorption sensor comprises an elongate optical cell configured to direct the first gas to flow through at least a portion of the elongate optical cell along a longitudinal axis of the elongate optical cell while the concentration of the precursor contained in the first gas is measured by the optical absorption sensor.

6. The method of claim 5, wherein the optical absorption sensor comprises an optical filter defining a first end of the elongate optical cell, and wherein the optical filter is configured to allow infrared radiation having one or more of the following wavenumbers to pass through: $1,600 \pm 100$ cm$^{-1}$ or $2,520 \pm 100$ cm$^{-1}$.

7. The method of claim 5, wherein the optical absorption sensor comprises an optical window defining a second end of the elongate optical cell, and wherein light entering into the elongate optical cell through the optical window comprises infrared radiation having a wavenumber ranging between about 400 cm$^{-1}$ and about 3,000 cm$^{-1}$.

8. The method of claim 1, wherein the first recipe set point defines a first concentration of the precursor contained in the first mixture of the first gas and the second gas, and wherein the second recipe set point defines a second concentration of the precursor contained in the second mixture of the first gas and the second gas.

9. The method of claim 1, further comprising:
flowing the second gas through a second delivery main line, wherein the second delivery main line is fluidly coupled with a third delivery subline and a fourth delivery subline downstream of the second delivery main line, the third delivery subline configured to provide fluid access to the first semiconductor processing chamber from the second delivery main line, the fourth delivery subline configured to provide fluid access to the second semiconductor processing chamber from the second delivery main line;
adjusting a first flow rate of the second gas delivered through the third delivery subline based at least in part on the measured concentration of the precursor; and
adjusting a second flow rate of the second gas delivered through the fourth delivery subline based at least in part on the measured concentration of the precursor;
wherein:
delivering the first mixture of the first gas delivered through the first delivery subline and the second gas comprises delivering the first mixture of the first gas delivered through the first delivery subline and the second gas delivered through the third delivery subline; and
delivering the second mixture of the first gas delivered through the second delivery subline and the second gas comprises delivering the second mixture of the first gas delivered through the second delivery subline and the second gas delivered through the fourth delivery subline.

10. A precursor delivery system, comprising:
a first delivery main line configured to deliver a first gas;
a precursor sensor configured to measure a concentration of a precursor contained in the first gas delivered through the first delivery main line to obtain a measured concentration of the precursor;
a first delivery subline and a second delivery subline fluidly coupled with and downstream of the first delivery main line, the first delivery subline configured to provide fluid access to a first semiconductor processing chamber from the first delivery main line, the second delivery subline configured to provide fluid access to a second semiconductor processing chamber from the first delivery main line, wherein the first delivery subline comprises a first flow controller configured to control a first flow rate of the first gas flowed into the first semiconductor processing chamber, and wherein the second delivery subline comprises a second flow controller configured to control a second flow rate of the first gas flowed into the second semiconductor processing chamber; and
a precursor delivery controller communicatively coupled with the precursor sensor, the first flow controller, and the second flow controller, wherein the precursor delivery controller is configured to control the first flow controller based on the measured concentration of the precursor so as to deliver a first mixture of the first gas and a second gas to the first semiconductor processing chamber in accordance with a first recipe set point, and wherein the precursor delivery controller is further configured to control the second flow controller based on the measured concentration of the precursor so as to deliver a second mixture of the first gas and the second gas to the second semiconductor processing chamber in accordance with a second recipe set point.

11. The precursor delivery system of claim 10, wherein the precursor delivery system is configured to deliver the first mixture to the first semiconductor processing chamber and the second mixture to the second semiconductor processing chamber simultaneously.

12. The precursor delivery system of claim 10, wherein the precursor comprises diborane, wherein the first gas further comprises hydrogen, and wherein the second gas comprises hydrogen.

13. The precursor delivery system of claim 10, wherein the precursor sensor comprises an optical absorption sensor.

14. The precursor delivery system of claim 13, wherein the optical absorption sensor comprises an elongate optical cell configured to direct the first gas to flow through at least a portion of the elongate optical cell along a longitudinal axis of the elongate optical cell while the concentration of the precursor contained in the first gas is measured by the optical absorption sensor.

15. The precursor delivery system of claim 14, wherein the optical absorption sensor comprises an optical filter defining a first end of the elongate optical cell, and wherein the optical filter is configured to allow infrared radiation having one or more of the following wavenumbers to pass through: $1,600\pm100$ cm$^{-1}$ or $2,520\pm100$ cm$^{-1}$.

16. The precursor delivery system of claim 14, wherein the optical absorption sensor comprises an optical window defining a second end of the elongate optical cell, and wherein light entering into the elongate optical cell through the optical window comprises infrared radiation having a wavenumber ranging between about 400 cm$^{-1}$ and about 3,000 cm$^{-1}$.

17. The precursor delivery system of claim 14, wherein the optical absorption sensor further comprises at least one of a pressure sensor configured to measure a pressure inside the elongate optical cell or a temperature sensor configured to measure a temperature inside the elongate optical cell.

18. The precursor delivery system of claim 10, wherein the precursor delivery system further comprises:
a second delivery main line configured to deliver the second gas; and
a third delivery subline and a fourth delivery subline fluidly coupled with and downstream of the second delivery main line, the third delivery subline configured to provide fluid access to the first semiconductor processing chamber from the second delivery main line, the fourth delivery subline configured to provide fluid access to the second semiconductor processing chamber from the second delivery main line, wherein the third delivery subline comprises a third flow controller configured to control a first flow rate of the second gas flowed into the first semiconductor processing chamber, and wherein the fourth delivery subline comprises a fourth flow controller configured to control a second flow rate of the second gas flowed into the second semiconductor processing chamber;
wherein the precursor delivery controller is further communicatively coupled with the third flow controller and the fourth flow controller, wherein the precursor delivery controller is further configured to control the third flow controller based on the measured concentration of the precursor so as to deliver the first mixture to the first semiconductor processing chamber in accordance with the first recipe set point, and wherein the precursor delivery controller is further configured to control the fourth flow controller based on the measured concentration of the precursor so as to deliver the second mixture to the second semiconductor processing chamber in accordance with the second recipe set point.

19. The precursor delivery system of claim 10, wherein the first recipe set point defines a first concentration of the precursor contained in the first mixture of the first gas and the second gas, and wherein the second recipe set point defines a second concentration of the precursor contained in the second mixture of the first gas and the second gas.

20. A semiconductor processing system, comprising:
a first semiconductor processing chamber and a second semiconductor processing chamber arranged in a tandem section of the semiconductor processing system; and
a precursor delivery system, the precursor delivery system comprising:
a first delivery main line configured to deliver a first gas, the first delivery main line fluidly coupled with a first delivery subline and a second delivery subline, the first delivery subline comprising a first flow controller and configured to provide fluid access to the first semiconductor processing chamber from the first delivery main line, the second delivery subline comprising a second flow controller and configured to provide fluid access to the second semiconductor processing chamber from the first delivery main line;
an optical absorption sensor installed along the first delivery main line and configured to measure a concentration of a precursor contained in the first gas to obtain a measured concentration of the precursor;
a second delivery main line configured to deliver a second gas, the second delivery main line fluidly coupled with a third delivery subline fluidly and a fourth delivery subline, the third delivery subline comprising a third flow controller and configured to provide fluid access to the first semiconductor processing chamber from the second delivery main line, the fourth delivery subline comprising a fourth flow controller and configured to provide fluid access to the second semiconductor processing chamber from the second delivery main line; and
a precursor delivery controller communicatively coupled with the optical absorption sensor and the first, second, third, and fourth flow controllers, wherein the precursor delivery controller is configured to control the first and third flow controllers based on the measured concentration of the precursor so as to deliver a first mixture of the first gas and the second gas to the first semiconductor processing chamber according to a first recipe set point, wherein the precursor delivery controller is further configured to control the second and fourth flow controllers based on the measured concentration of the precursor so as to deliver a second mixture of the first gas and the second gas to the second semiconductor processing chamber according to a second recipe set point, and wherein the precursor delivery system is configured to deliver the first mixture and the second mixture simultaneously.

* * * * *